(12) United States Patent
Lim et al.

(10) Patent No.: US 7,687,389 B2
(45) Date of Patent: Mar. 30, 2010

(54) METHOD FOR FABRICATING SEMICONDUCTOR DEVICE

(75) Inventors: Kwan-Yong Lim, Ichon-shi (KR); Min-Gyu Sung, Ichon-shi (KR); Heung-Jae Cho, Ichon-shi (KR); Hong-Seon Yang, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 268 days.

(21) Appl. No.: 11/448,678

(22) Filed: Jun. 8, 2006

(65) Prior Publication Data

US 2007/0066013 A1    Mar. 22, 2007

(30) Foreign Application Priority Data

Sep. 22, 2005  (KR) .................... 10-2005-0088344

(51) Int. Cl.
  *H01L 21/3205*  (2006.01)
  *H01L 21/4763*  (2006.01)
(52) U.S. Cl. ............. 438/592; 257/E21.2; 257/E29.157
(58) Field of Classification Search ........................ None
  See application file for complete search history.

(56) References Cited

U.S. PATENT DOCUMENTS 6,060,361 A * 5/2000 Lee ........................... 438/283
6,306,743 B1 * 10/2001 Lee ........................... 438/592
2005/0009281 A1 * 1/2005 Lim et al. .................. 438/287
2005/0073011 A1 * 4/2005 Taguwa ..................... 257/371
2005/0110058 A1 * 5/2005 Hu ............................ 257/288
2006/0003565 A1 * 1/2006 Sasaki ....................... 438/592

FOREIGN PATENT DOCUMENTS

JP    2000-332245    11/2000

OTHER PUBLICATIONS

Notice of Preliminary Rejection from the Korean Intellectual Property Office, dated Aug. 28, 2006, in Korean Patent Application No. 2005-88344.

* cited by examiner

*Primary Examiner*—W. David Coleman
*Assistant Examiner*—Shaka Scarlett
(74) *Attorney, Agent, or Firm*—IP & T Law Firm PLC

(57) ABSTRACT

A method for fabricating a semiconductor device includes forming a gate insulation layer over a substrate, forming a first gate conductive layer over the gate insulation layer, forming a barrier metal over the first gate conductive layer, sequentially forming a second gate conductive layer and a gate hard mask over the barrier metal, patterning the gate hard mask, the second gate conductive layer, the barrier metal, the first gate conductive layer, and the gate insulation layer to form a gate pattern, and performing a plasma selective gate re-oxidation process on the gate pattern.

10 Claims, 12 Drawing Sheets

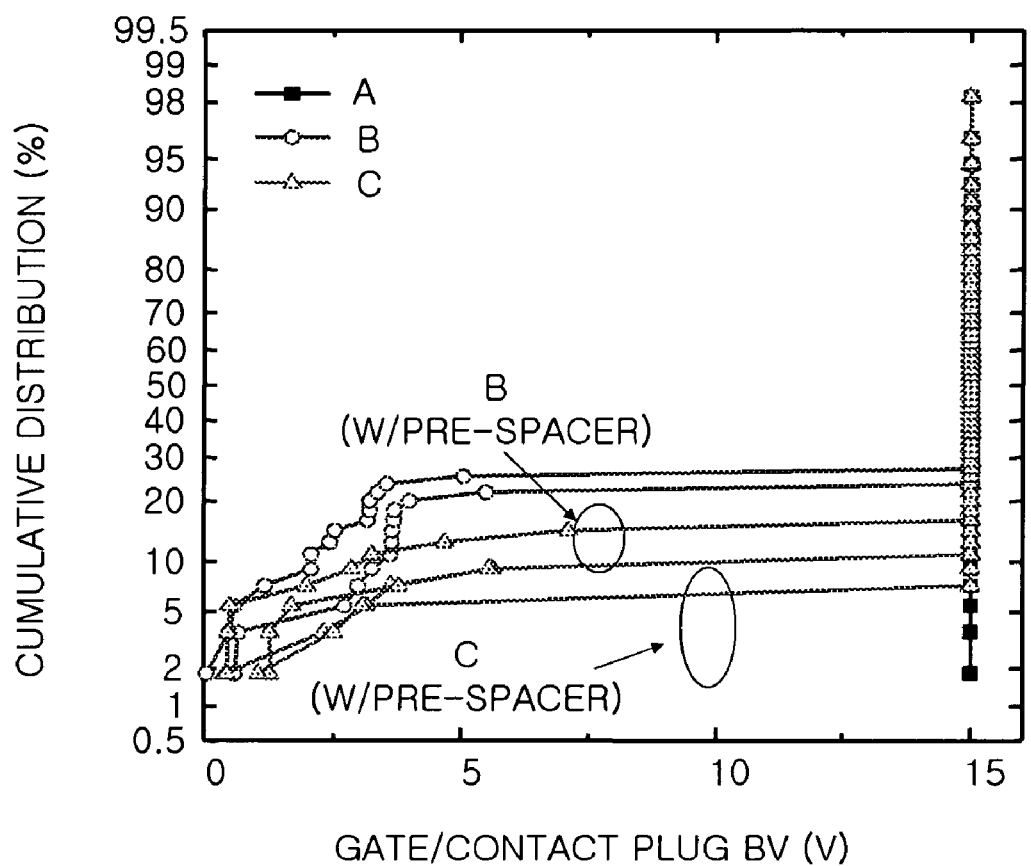

METHOD FOR FABRICATING SEMICONDUCTOR DEVICE

RELATED APPLICATION

This application is based upon and claims the benefit of priority from the prior Korean Patent Application No. 2005-88344, filed Sep. 22, 2005, the entire contents of which are incorporated herein by reference.

TECHNICAL FIELD

The present invention relates to a method for fabricating a semiconductor device; and more particularly, to a method for fabricating a semiconductor device using a low temperature plasma selective gate re-oxidation process.

DESCRIPTION OF RELATED ARTS

During a fabrication process of a semiconductor device using a polysilicon layer as a gate electrode, a gate oxide layer is generally damaged while etching the polysilicon layer. Thus, in order to restore the damaged gate oxide layer while maintaining a resistance of the gate electrode, a re-oxidation process has been employed and allows selective oxidation of sidewalls of the polysilicon gate electrode.

The re-oxidation process restores micro trenches and losses generated in the gate oxide layer during the gate electrode etching process; oxidizes the residual polysilicon layer; and improves reliability by increasing the thickness of the gate oxide layer on the edge of the gate electrode.

Meanwhile, a stacked structure including a polysilicon layer and a metal layer, that is, a poly-metal gate electrode has been used in order to reduce the resistance of the gate electrode. For example, a tungsten polycide gate electrode having a $WSi_x$/poly-Si structure and a tungsten poly-metal gate electrode having a W/WN/poly-Si structure, which have low resistances, may be used.

However, a poly-metal gate electrode has problems such as a rapid volume expansion during a subsequent high temperature thermal process or oxidation process; an increase in sheet resistance; and a reaction at the interface between the polysilicon layer and the metal layer. The most serious limitation of a poly-metal gate electrode is that the metal layer in the poly-metal gate electrode oxidizes in an oxidation atmosphere. In order to overcome this limitation, a selective gate re-oxidation process may be applied to form a poly-metal gate electrode. The selective gate re-oxidation process oxidizes only the polysilicon layer with exposed sidewalls, and does not oxidize the metal layer. The selective gate re-oxidation process may be performed in an oxidation atmosphere rich in hydrogen ($H_2$).

FIGS. 1A to 1E illustrate cross-sectional views and graphs of a first conventional method for fabricating a semiconductor device.

As shown in FIG. 1A, a gate oxide layer 12 is formed over a substrate 11. A gate pattern is formed over the gate oxide layer 12, the gate pattern including a polysilicon layer 13, a tungsten silicide layer 14, a tungsten nitride layer 15, a tungsten layer 16, and a gate hard mask 17 formed in sequential order. The tungsten silicide layer 14 and the tungsten nitride layer 15 are used as a diffusion barrier between the polysilicon layer 13 and the tungsten layer 16.

Referring to FIG. 1B, after the gate pattern is formed, a gate re-oxidation process is performed by performing a thermal process at a temperature of approximately 850° C. or higher.

During the gate re-oxidation process, nitrogen atoms (N) emitted from decomposition of the tungsten nitride layer 15 due to the high temperature react with the tungsten silicide layer 14 to form a thin tungsten-silicon-nitrogen (W—Si—N) layer 18. The tungsten silicide layer 14 generally maintains a uniform thickness during a thermal process performed at a temperature ranging from approximately 350° C. to approximately 600° C. However, during a thermal process at a temperature of approximately 700° C. or higher, the tungsten silicide layer 14 crystallizes into grains as denoted with a reference numeral 14A in FIG. 1B.

FIG. 1C is a graph illustrating the Kelvin contact resistance (Rc) and the sheet resistance (Rs) between a tungsten layer and a p+ polysilicon layer using different barrier metals. A reference letter A represents a tungsten/tungsten nitride (W/WN) layer, a reference letter B represents a tungsten/tungsten nitride/titanium nitride/titanium (W/WN/TiN/Ti) layer, and a reference letter C refers to a tungsten/tungsten nitride/tungsten silicide (W/WN/$WSi_x$) layer.

A has a higher contact resistance than B and C, and has a sheet resistance lower than that of B but higher than that of C. B has the lowest contact resistance but the highest sheet resistance.

FIG. 1D is a graph illustrating the change of the contact resistance between a tungsten layer and a polysilicon layer during a thermal selective gate re-oxidation process performed at a high temperature of approximately 850° C. or higher. A tungsten nitride layer and a tungsten nitride/tungsten silicide layer are used as barrier metals. Oxidation of the tungsten layer may be reduced by supplying $H_2$ in the oxidation atmosphere. However, materials at the interface between the tungsten layer and the polysilicon layer, such as titanium nitride, titanium, tungsten silicon nitride, and tungsten silicide still oxidize.

FIG. 1E is a graph of secondary ion mass spectrometry illustrating the extent of interface oxidation of a gate including a polysilicon layer and a tungsten layer formed in a stacked structure, which has been subjected to a thermal selective gate re-oxidation process or a plasma selective gate re-oxidation process. Curve "A" shows the count of oxygen ions after the gate was subjected to the thermal selective gate re-oxidation process, and curve "B" shows the count of oxygen ions after the gate was subjected a plasma selective gate re-oxidation process. When the thermal selective gate re-oxidation process is applied, oxygen ions penetrate into sidewalls of the tungsten layer and diffuse to the interface between the tungsten layer and the polysilicon layer when compared with the plasma selective gate re-oxidation process.

FIG. 2A shows a cross-sectional view of a semiconductor device formed by a second conventional method. The second conventional method reduces oxygen penetration into sidewalls of a tungsten layer during a thermal selective gate re-oxidation process.

A gate oxide layer 22 is formed over a substrate 21. A gate pattern, including a polysilicon layer 23, a barrier metal 24, a tungsten layer 25, and a gate hard mask 26 formed in sequential order, is formed over the gate oxide layer 22 by a first gate etching process. The first gate etching process etches up to a predetermined upper portion of the polysilicon layer 23.

The barrier metal 24 includes one selected from a group consisting of a tungsten nitride layer, a tungsten nitride/titanium nitride/titanium layer, a tungsten nitride/titanium layer, a tungsten nitride/tungsten silicide layer, and a tungsten nitride/tungsten silicon nitride/tungsten silicide layer.

A spacer nitride layer (or a capping nitride layer) is formed over the gate pattern to cap the tungsten layer 25 and the barrier metal 24.

The spacer nitride layer is etched to form so-called pre-spacers 27 on sidewalls of the gate pattern. Then, the remaining portions of the polysilicon layer 23 are etched away by performing a second gate etching process.

A selective gate re-oxidation process is performed in a water ($H_2O$)/$H_2$ atmosphere at a temperature of approximately 850° C. or higher to form gate re-oxidation layers 28 on sidewalls of the polysilicon layer 23 and over the gate oxide layer 22.

FIG. 2B is a graph illustrating fail characteristics of self-aligned contacts to gate electrodes with spacers formed as described above and with different barrier metals, i.e., W/WN ("A"), W/WN/TiN/Ti ("B"), and W/WN/WSi$_x$ ("C"). The fail characteristics of self-aligned contact deteriorate when defects are generated during a gate etching process. Moreover, during the formation of the spacers as described above, poly-crystallization may occur in the underlying polysilicon layer due to the thermal process, and may result in deteriorated gate characteristics.

SUMMARY

Consistent with the present invention, there is provided a method for fabricating a semiconductor device, which can reduce an increase in interfacial resistance between a metal layer and a polysilicon layer during a selective gate re-oxidation process.

Consistent with the present invention, there is provided a method for fabricating a semiconductor device, including forming a gate insulation layer over a substrate; forming a first gate conductive layer over the gate insulation layer; forming a barrier metal over the first gate conductive layer; sequentially forming a second gate conductive layer and a gate hard mask over the barrier metal; patterning the gate hard mask, the second gate conductive layer, the barrier metal, the first gate conductive layer, and the gate insulation layer to form a gate pattern; and performing a plasma selective gate re-oxidation process on the gate pattern.

Consistent with the present invention, there is also provided a method for fabricating a semiconductor device, including forming a gate insulation layer over a substrate; forming a first gate conductive layer over the gate insulation layer; forming a barrier metal over the first gate conductive layer, the barrier metal including metal silicide; forming a second gate conductive layer and a gate hard mask over the barrier metal to form a gate pattern; and performing a plasma selective gate re-oxidation process on the gate pattern.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The above and other features will become better understood with respect to the following description of the specific embodiments given in conjunction with the accompanying drawings, in which:

FIG. 2B is a graph illustrating characteristics of a device formed by the second conventional method for fabricating a semiconductor device;

DETAILED DESCRIPTION

A method for fabricating a semiconductor device consistent with embodiments of the present invention will be described in detail with reference to the accompanying drawings.

Figure 3A:
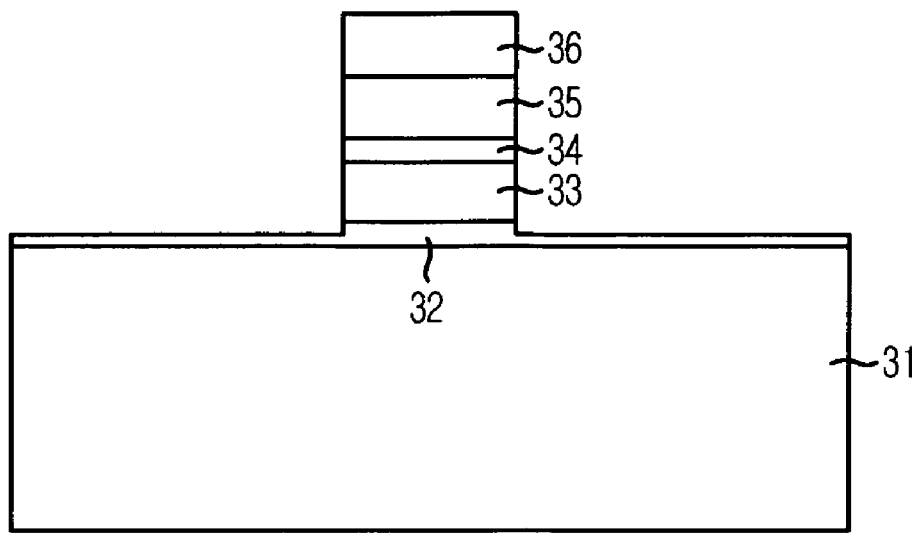
FIGS. 3A and 3B are cross-sectional views illustrating a method for fabricating a semiconductor device consistent with the present invention.
Figure 3B:
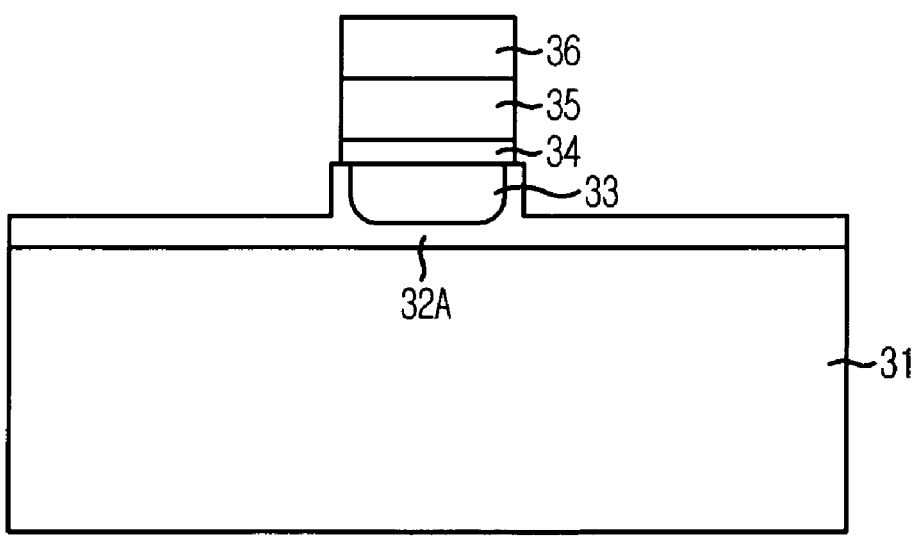

FIGS. 3A and 3B are cross-sectional views illustrating a method for fabricating a semiconductor device consistent with the present invention.

Referring to FIG. 3A, a gate oxide layer is formed as a gate insulation layer over a substrate 31 using a thermal oxidation method. Substrate 31 may have diffusion wells and device isolations formed therein. The gate oxide layer has a thickness ranging from approximately 20 Å to approximately 100 Å.

A first gate conductive layer is formed over the gate oxide layer. Then, a barrier metal is formed over the first gate conductive layer. The first gate conductive layer may comprise polysilicon, or polysilicon germanium (poly-Si$_{(1-x)}$—Ge$_x$), where x representing an atomic ratio of Ge ranges from approximately 0.01 to approximately 0.99. Alternatively, the first gate conductive layer may comprise a silicide layer including one selected from the group consisting of nickel (Ni), chromium (Cr), cobalt (Co), titanium (Ti), tungsten (W), tantalum (Ta), and hafnium (Hf). The barrier metal may comprise a metal silicide and one of a metal nitride and a metal silicon nitride formed in sequential order. The metal nitride may comprise tungsten nitride (WN). The metal silicon nitride may comprise one selected from a group consisting of tungsten silicon nitride (WSiN), tantalum silicon nitride (TaSiN), titanium silicon nitride (TiSiN), molybdenum silicon nitride (MoSiN), hafnium silicon nitride (HfSiN), zirconium silicon nitride (ZrSiN), cobalt silicon nitride (CoSiN), chromium silicon nitride (CrSiN), and nickel silicon nitride (NiSiN). The metal silicide layer may comprise an amorphous tungsten silicide, and may have a thickness ranging from approximately 20 Å to approximately 200 Å. Alternatively, the metal silicide may comprise one selected from a group consisting of tantalum silicide (TaSi$_x$), titanium silicide (TiSi$_x$), molybdenum silicide (MoSi$_x$), hafnium silicide (HfSi$_x$), zirconium silicide (ZrSi$_x$), cobalt silicide (CoSi$_x$), chromium silicide (CrSi$_x$), and nickel silicide (NiSi$_x$).

A second gate conductive layer is formed over the barrier metal, and then, a nitride-based gate hard mask is formed over the second gate conductive layer. The second gate conductive layer may comprise one selected from the group consisting of W, Ta, Ti, molybdenum (Mo), Hf, zirconium (Zr), Co, Cr, Ni, platinum (Pt), and ruthenium (Ru).

A photoresist pattern (not shown) is formed over the gate hard mask. The gate hard mask is etched using the photoresist pattern as an etch mask to form a patterned gate hard mask 36, and then, the photoresist pattern is stripped away.

Using the patterned gate hard mask 36 as an etch mask, the second gate conductive layer, the barrier metal, the first gate conductive layer, and predetermined portions of the gate oxide layer are sequentially patterned to form a gate pattern including a patterned gate oxide layer 32, a patterned first gate conductive layer 33, a patterned barrier metal 34, a patterned second gate conductive layer 35, and the patterned gate hard mask 36, where the patterned first gate conductive layer 33, the patterned barrier metal 34, and the patterned second gate conductive layer 35 constitute a gate electrode.

Referring to FIG. 3B, a plasma selective gate re-oxidation process is performed on the resulting substrate structure in FIG. 3A.

The plasma selective gate re-oxidation process is performed to restore micro trenches and plasma damages generated on the patterned gate oxide layer 32 after the gate pattern is formed by etching. Also, the plasma selective gate re-oxidation process is performed to improve reliability of the device by oxidizing remaining electrode materials over the substrate 31. The plasma selective gate re-oxidation process also increases a thickness of portions of the patterned gate oxide layer 32, resulting in a gate re-oxidation layer 32A having a greater thickness than the patterned gate oxide layer 32 shown in FIG. 3A. During the plasma selective gate re-oxidation process, exposed portions of the patterned first gate conductive layer 33 are partially oxidized. Therefore, the gate re-oxidation layer 32A is also formed on sidewalls of the patterned first gate conductive layer 33. Due to a difference in re-oxidation rate between portions of the gate re-oxidation layer 32A contacting the patterned first gate conductive layer 33 and not contacting the patterned first gate conductive layer 33, graded gate oxide (GGO), i.e., gate bird's beak (GBB), is formed on the bottom edges of the patterned first gate conductive layer 33.

Consistent with the present invention, the plasma selective gate re-oxidation process is performed at a temperature of the substrate 31 maintained at approximately 400° C. to approximately 800° C., using a reaction gas which includes one of a mixed gas of oxygen ($O_2$)/hydrogen ($H_2$) and a mixed gas of $O_2$/deuterium ($D_2$), and using one of radio frequency (RF) and microwave as a plasma generator.

Also, to improve characteristics of the patterned gate oxide layer 32 during the plasma selective gate re-oxidation process, an additional thermal process can be performed in a vacuum, nitrogen ($N_2$), or nitrous oxide ($N_2O$) atmosphere.

Figure 4A:
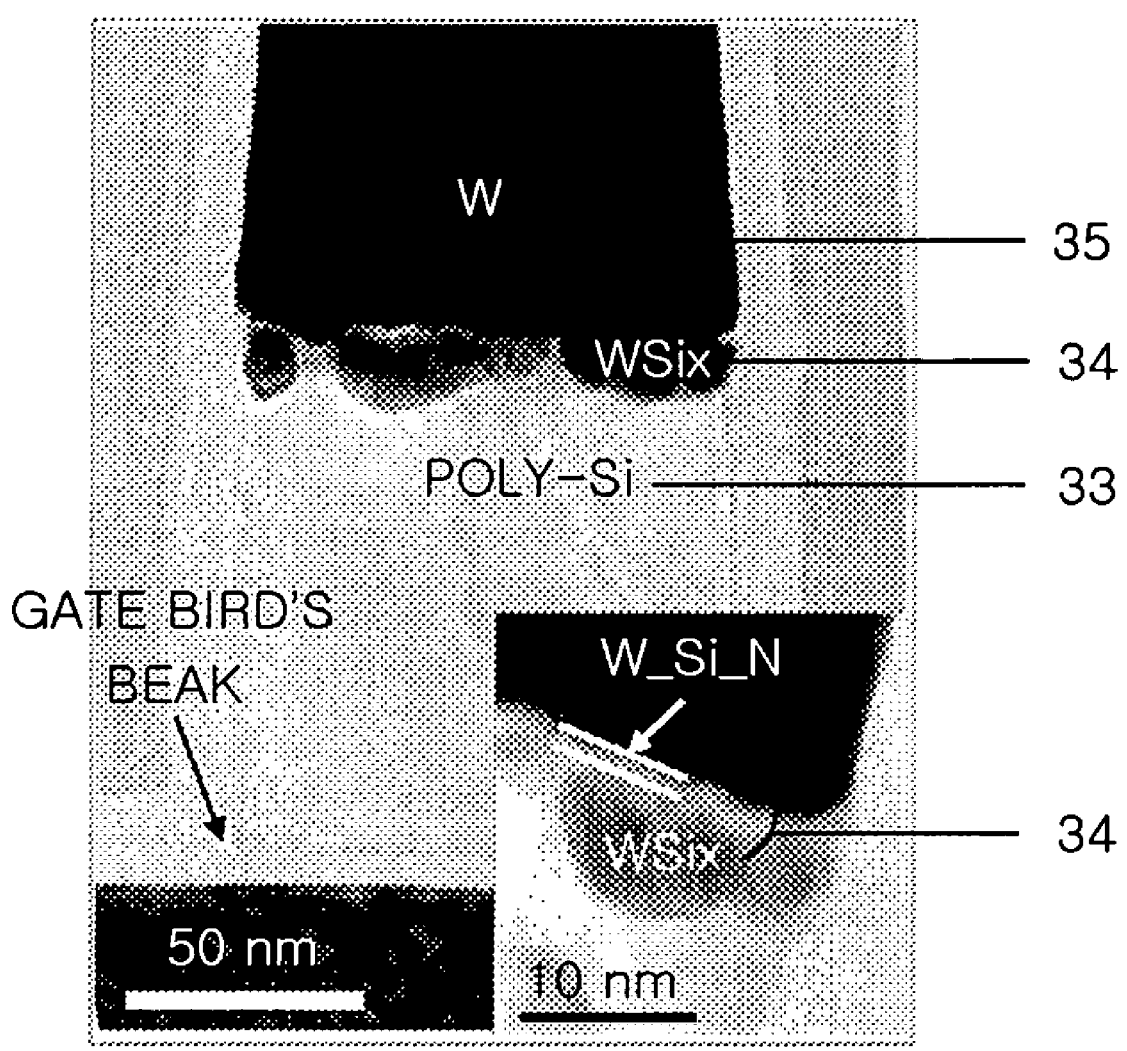
FIG. 4A is a micrographic view illustrating a device consistent with the present invention.

FIG. 4A is a micrographic view illustrating a device consistent with the present invention, and FIGS. 4B to 4E are graphs illustrating characteristics of the device consistent with the present invention.

The gate electrode is shown in a micrographic view after the plasma selective gate re-oxidation process is performed on the gate electrode, wherein the patterned second gate conductive layer 35 comprises tungsten, the patterned barrier metal 34 comprises a tungsten nitride layer (or tungsten silicon nitride layer) and a tungsten silicide layer, and the patterned first gate conductive layer 33 comprises polysilicon. Nitrogen atoms (N) emitted from decomposition of the tungsten nitride (WN) layer reacts with the tungsten silicide ($WSi_x$) layer in the patterned barrier metal 34 to form a tungsten-silicon-nitrogen (W—Si—N) layer at an upper portion of the tungsten silicide layer. The W—Si—N layer having characteristics of both an insulation structure and a conductive structure can result in a decrease of an interfacial resistance of a gate stack of tungsten-polysilicon.

Figure 4B:
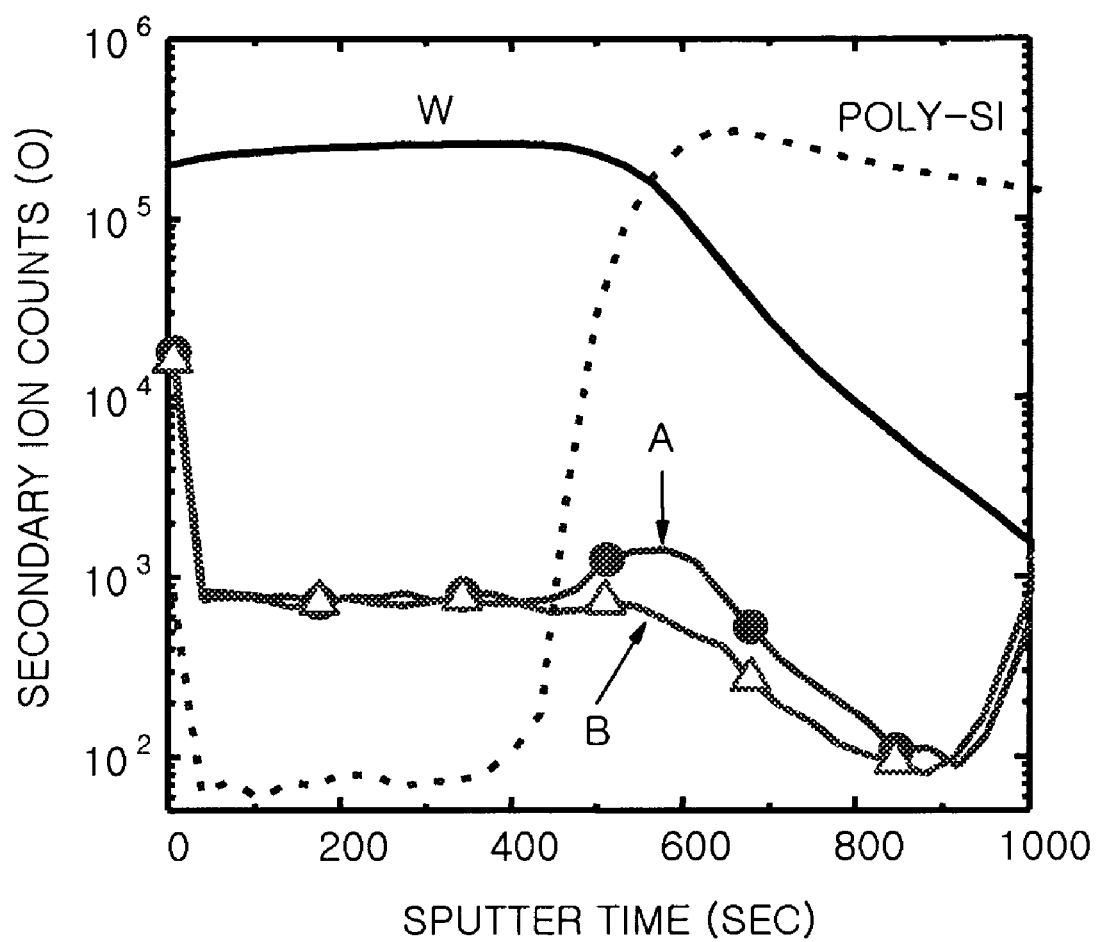
FIGS. 4B to 4E are graphs illustrating characteristics of a device consistent with the present invention.

FIG. 4B illustrates a secondary ion mass spectroscopy (SIMS) depth profile of a tungsten-polysilicon gate, subjected to a thermal selective gate re-oxidation process or a plasma selective gate re-oxidation process. Curve "A" shows the count of oxygen ions in a gate subjected to the thermal selective gate re-oxidation process and curve "B" shows the count of oxygen ions in a gate subjected the plasma selective gate re-oxidation process. A larger amount of oxygen is detected at the interface between a tungsten layer and a polysilicon layer when the thermal selective gate re-oxidation process is performed than when the plasma selective gate re-oxidation process is performed.

Figure 1A:
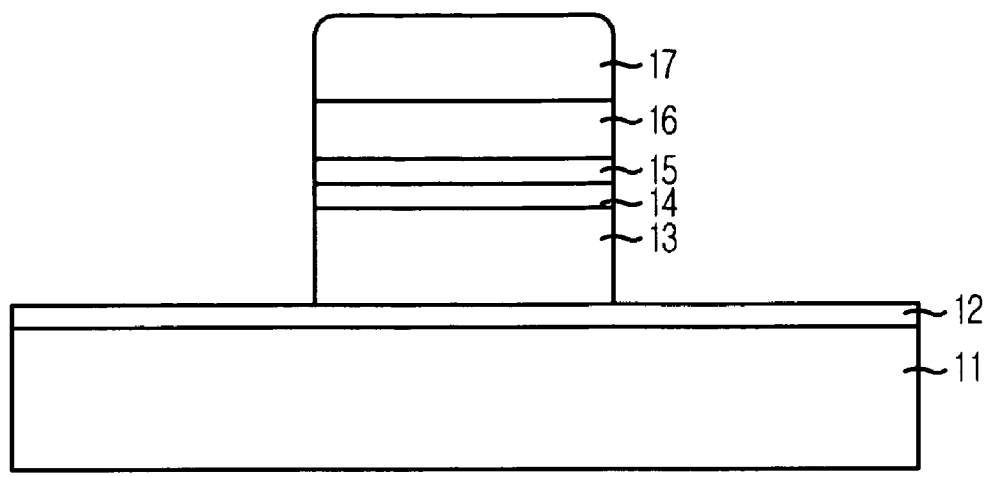
FIGS. 1A and 1B are cross-sectional views illustrating a first conventional method for fabricating a semiconductor device.
Figure 1B:
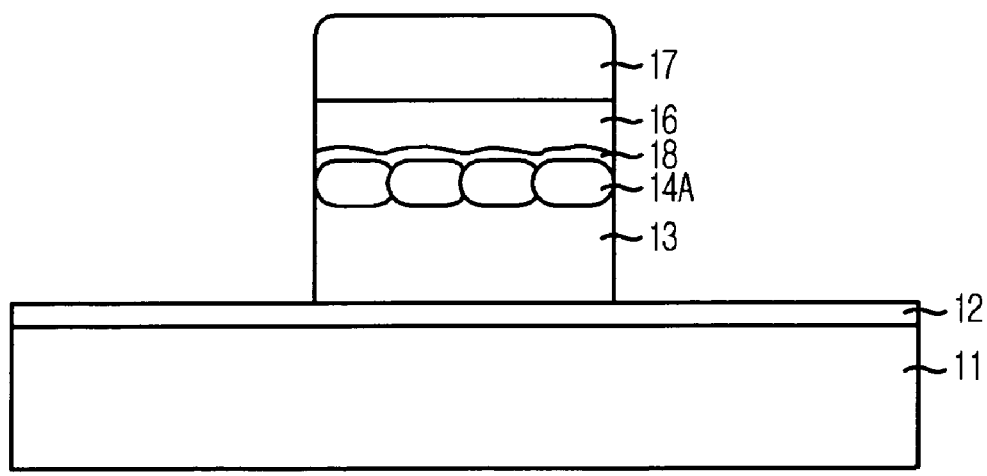
Figure 1C:
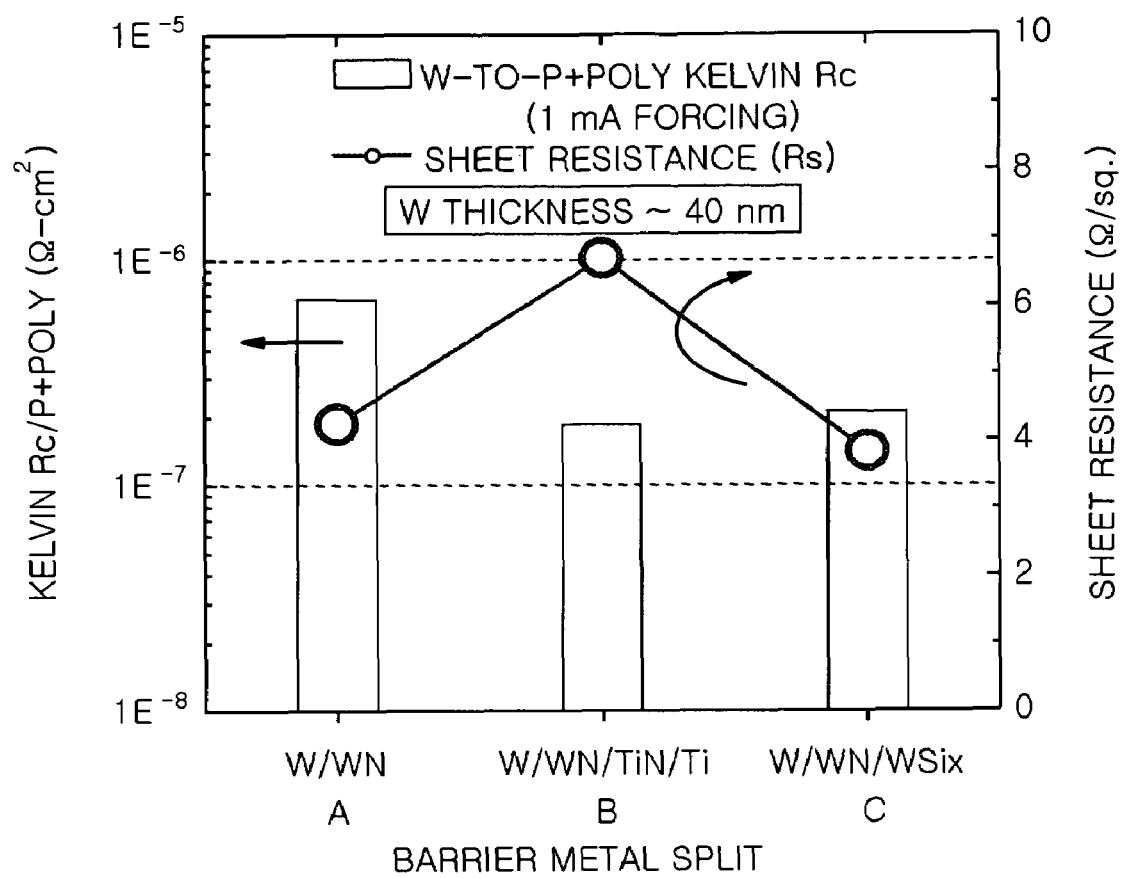
FIGS. 1C to 1E are graphs illustrating characteristics of a device formed by the first conventional method for fabricating a semiconductor device.
Figure 1D:
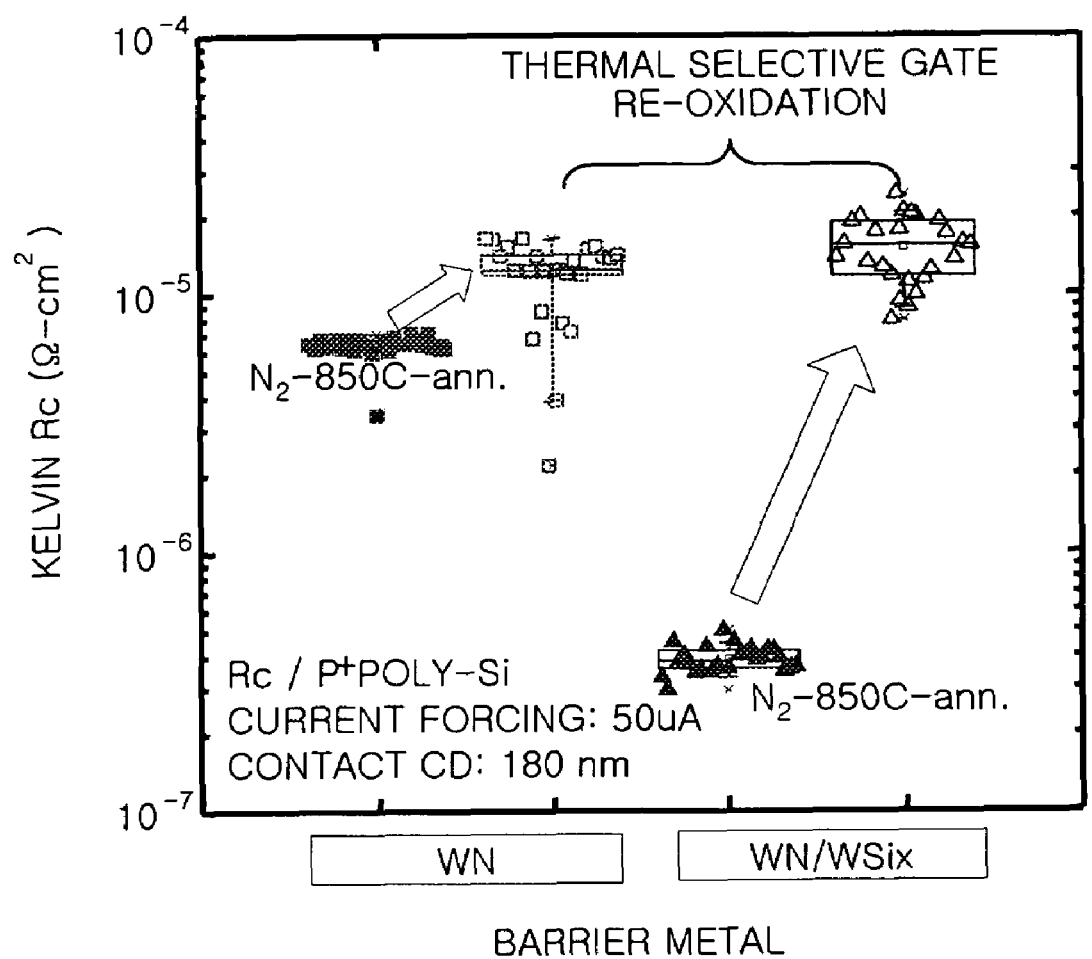
Figure 1E:
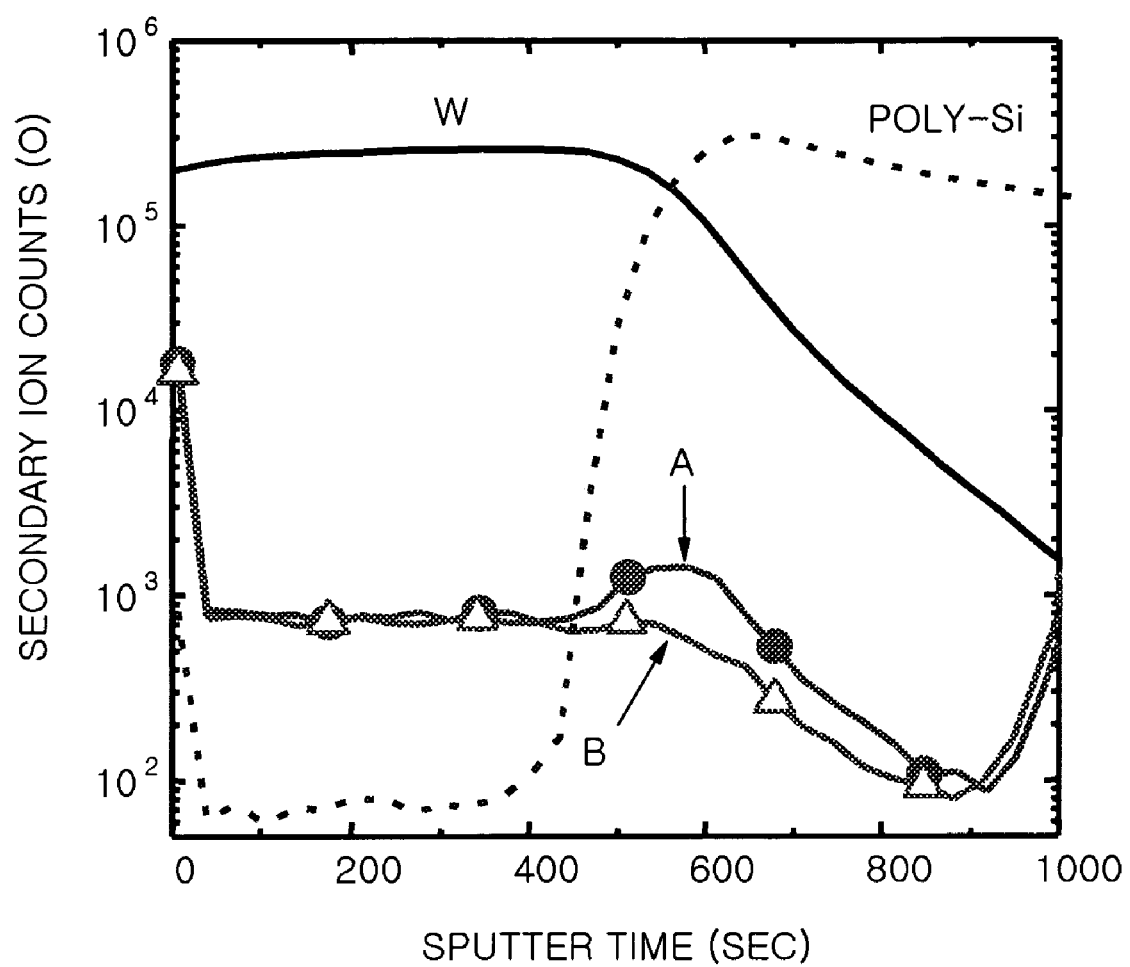
Figure 2A:
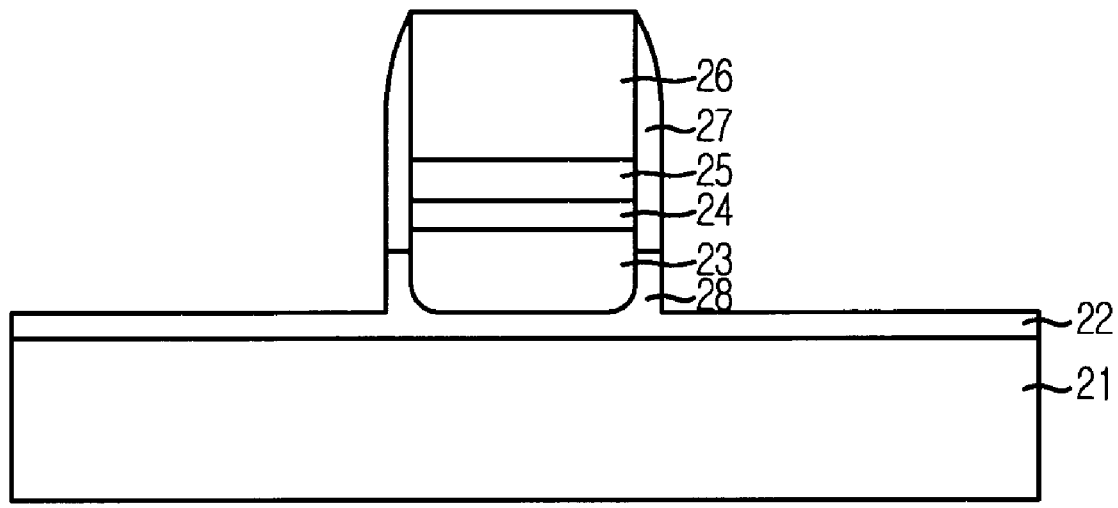
FIG. 2A is a cross-sectional view illustrating a second conventional method for fabricating a semiconductor device.
Figure 4C:
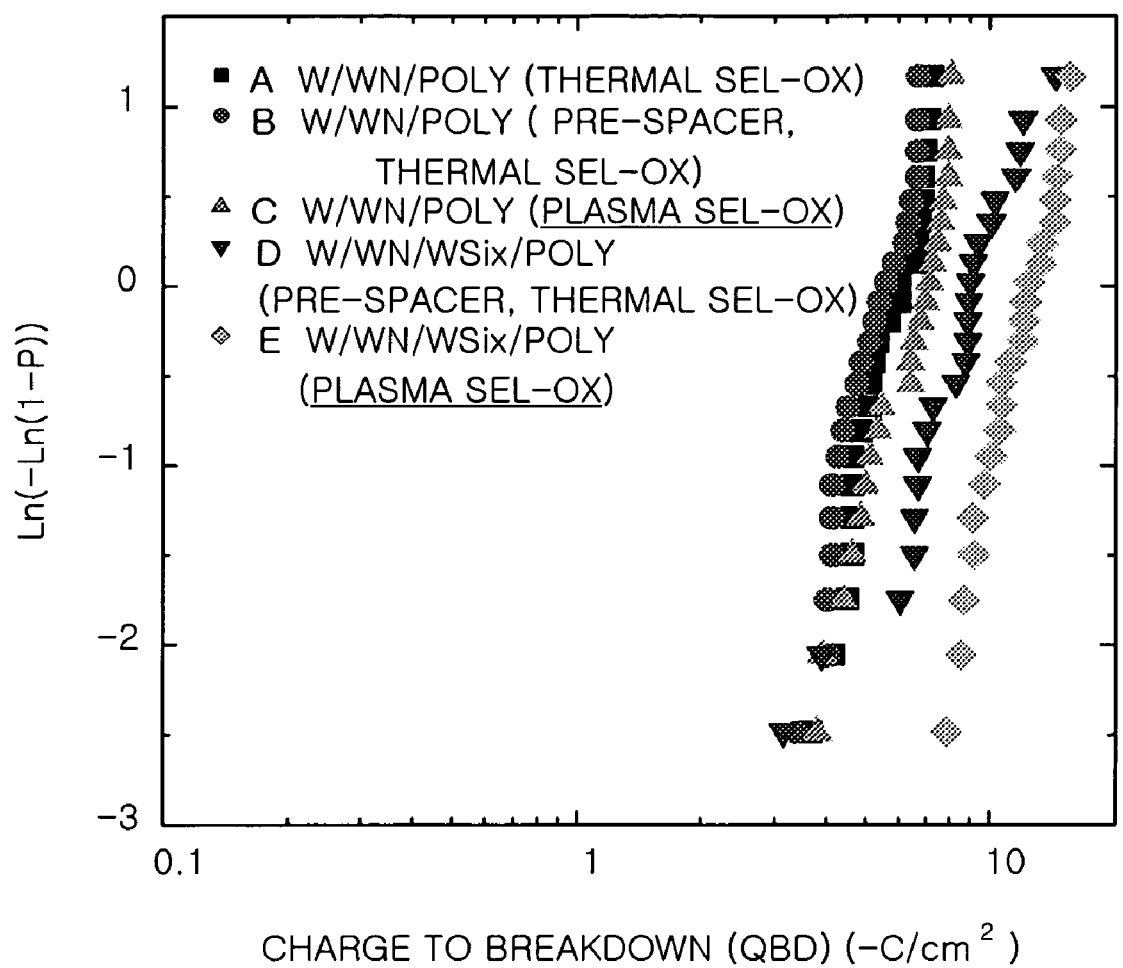

FIG. 4C is a graph illustrating a charge-to-breakdown (QBD) characteristic of different tungsten-polysilicon gate structures when a thermal selective gate re-oxidation process or a plasma selective gate re-oxidation process is performed. A curve labeled by a reference letter "A" represents the QBD characteristic of a first stacked structure including a polysilicon layer, a tungsten nitride layer, and a tungsten layer when the thermal selective gate re-oxidation process is performed. A curve labeled by a reference letter "B" represents the QBD characteristic of the first stacked structure when the thermal selective gate re-oxidation process is performed and a pre-spacer such as pre-spacer 27 shown in FIG. 2A is used. A curve labeled by a reference letter "C" represents the QBD characteristic of the first stacked structure when the plasma selective gate re-oxidation process is performed. A curve labeled by a reference letter "D" represents the QBD characteristic of a second stacked structure including a polysilicon layer, a tungsten silicide layer, a tungsten nitride layer, and a tungsten layer, when the thermal selective gate re-oxidation process is performed and with a pre-spacer is used. A curve labeled by a reference letter "E" represents the QBD characteristic of the second stacked structure when the plasma selective gate re-oxidation process is performed.

The QBD characteristic is better when the plasma selective gate re-oxidation process is performed and the barrier metal comprises a tungsten nitride layer and a tungsten silicide layer (curve "E"), than when the thermal selective gate re-oxidation process is performed and the barrier metal comprises the tungsten nitride layer (curve "A"), because the tungsten silicide layer functions as a buffer for buffering mechanical stress of a nitride-based gate hard mask during a subsequent thermal process.

Thus, using a combination of a tungsten nitride layer and a tungsten silicide layer as the barrier metal can improve the QBD characteristic when compared to using only a tungsten nitride layer as the barrier metal. Also, if the tungsten nitride layer is used as the barrier metal, the QBD characteristic is better when the thermal selective gate re-oxidation process is performed and the pre-spacer is used, than when the thermal selective gate re-oxidation process is performed without the pre-spacer. The QBD characteristic is better when the plasma selective gate re-oxidation process is performed than when the thermal selective gate re-oxidation process is performed and the pre-spacer is used.

When using both the tungsten nitride layer and the tungsten silicide layer as the barrier metal, the QBD characteristic is better when the plasma selective gate re-oxidation process is performed than when the thermal selective gate re-oxidation process is performed and the pre-spacer is used.

Therefore, if the plasma selective gate re-oxidation process is performed at approximately 800° C. or below, the deterioration of the gate oxide layer characteristic caused by hydrogen can be reduced, and thus, an improved QBD characteristic can be achieved when compared to the thermal selective gate re-oxidation process.

Figure 4D:
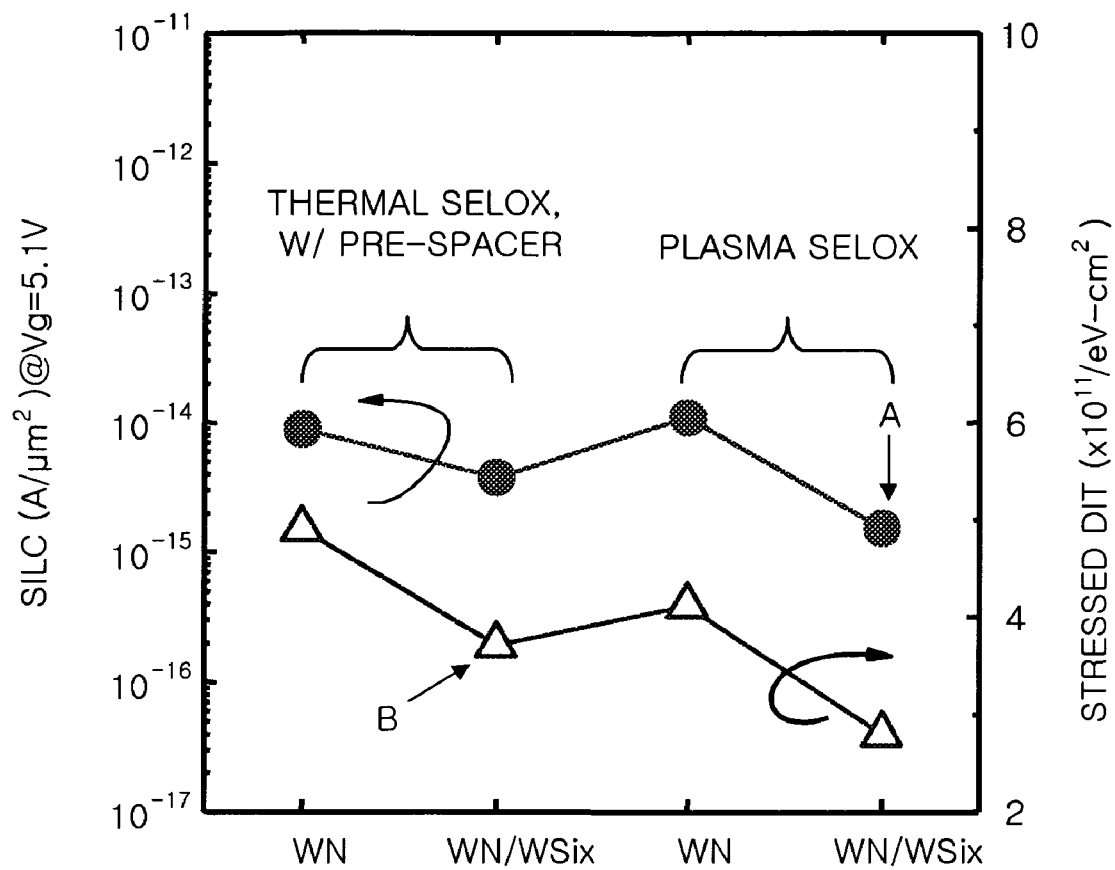

FIG. 4D is a graph illustrating a stress induced leakage current (SILC) characteristic and a stressed interface trap density (DIT) characteristic of a gate oxide layer of a semiconductor device having different metal barriers and subjected to selective gate re-oxidation processes. Herein, a reference letter "A" represents the SILC characteristic and a reference letter "B" represents the stressed DIT characteristic. In the graph, the characteristics of a semiconductor device subjected to a thermal selective gate re-oxidation process are illustrated on the left and the characteristics of a semiconductor device subjected to a plasma selective gate re-oxidation process is illustrated on the right. The comparison shows that the SILC characteristic and the stressed DIT characteristic are better when the plasma selective gate re-oxidation process is performed and a tungsten nitride/tungsten silicide layer is used as a barrier metal, than when the thermal selective gate re-oxidation process is performed and a tungsten nitride/tungsten silicide layer is used as the barrier metal.

Figure 4E:
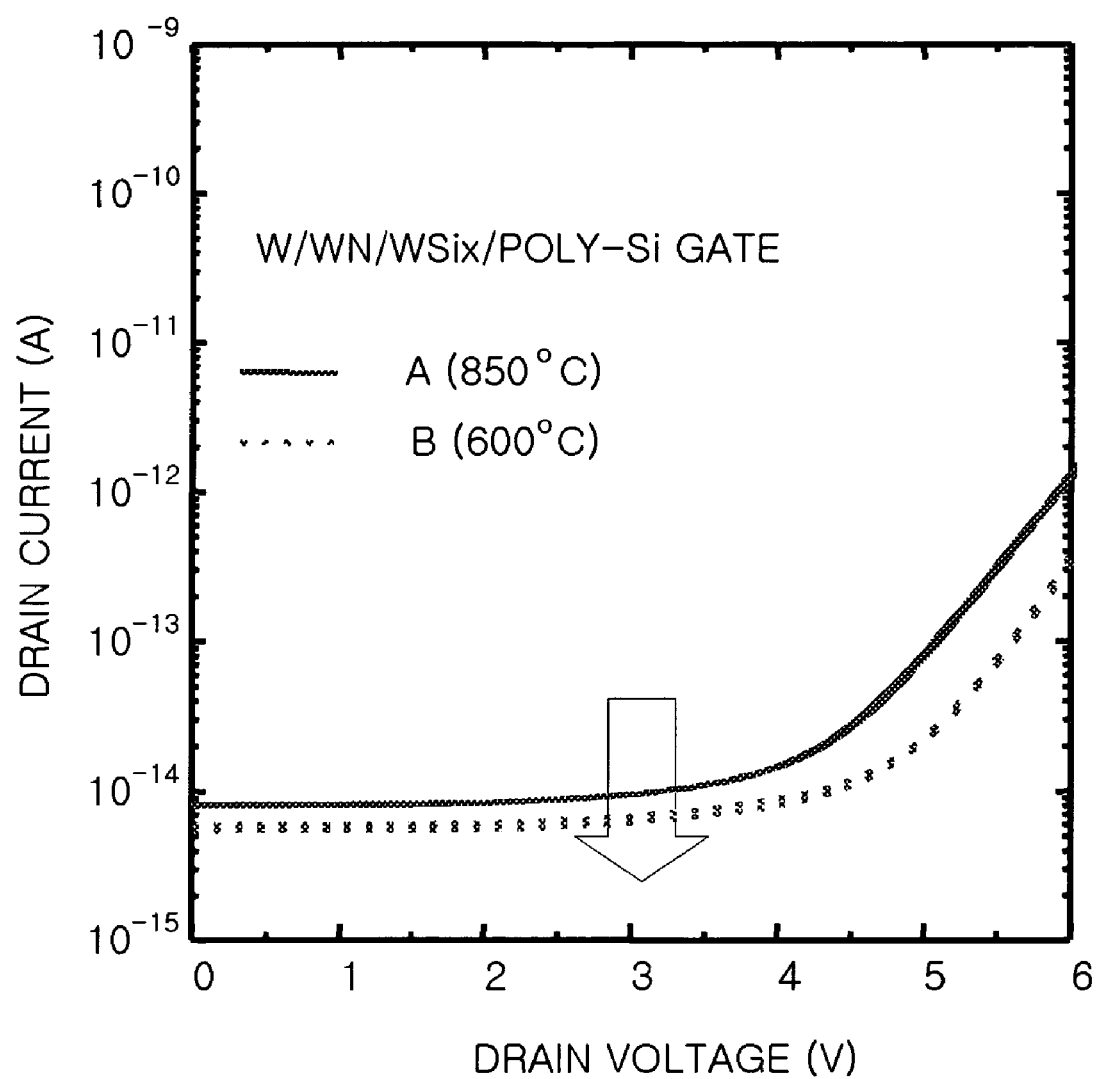

FIG. 4E is a graph illustrating a cell junction leakage characteristic of an array cell transistor in a dynamic random access memory (DRAM) formed by methods consistent with the present invention. As the graph shows, a plasma selective gate re-oxidation process (curve "A") improves the cell junction leakage characteristic and a gate induced drain leakage (GIDL) characteristic in low and high fields of a drain voltage and current, and thus, operational characteristics of the device can be improved, as compared to a thermal selective gate re-oxidation process.

Thus, a QBD characteristic can be improved by using a barrier metal including a tungsten silicide layer inserted under a tungsten nitride layer, and performing the plasma selective gate re-oxide layer at a low temperature.

In the above, the gate electrode is described to comprise a tungsten poly-metal structure. However, methods consistent with the present invention may be applied to other types of gate electrodes in structures such as: tungsten silicide/polysilicon, titanium silicide/polysilicon/nickel silicide, polysilicon, chromium silicide/polysilicon, cobalt silicide/polysilicon, and hafnium silicide/polysilicon.

Furthermore, embodiments of the present invention may also be applied to direct metal gate electrodes such as a tungsten nitride layer, a titanium nitride layer, a ruthenium tantalum nitride layer, a ruthenium nitride layer, and a ruthenium layer.

According to the specific embodiments of the present invention, by applying the plasma selective gate re-oxidation process on a semiconductor device having a tungsten poly-metal gate structure with a diffusion barrier metal, the oxidation of the interface between the tungsten layer and the diffusion barrier metal can be reduced, wherein the diffusion barrier metal includes one of WN/TiN/Ti, WN/Ti, WN/WSi$_x$, and WN/WSiN/WSi$_x$. Thus, a complementary metal oxide semiconductor field effect transistor (CMOSFET) device and a memory device capable of high-speed operation can be fabricated.

Furthermore, methods and semiconductor devices consistent with the present invention reduce a deterioration of a gate oxide layer in the devices, thereby improving the reliability of the gate oxide layer. Moreover, the junction leakage characteristic in the cell transistor of a memory device can be improved by the low temperature maintained during the plasma selective gate re-oxidation process, i.e., below approximately 800° C. Also, a data retention time of the memory device can be improved due to the improved junction leakage characteristic.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming a gate insulation layer over a substrate;
    forming a first gate conductive layer over the gate insulation layer;
    forming a barrier metal over the first gate conductive layer, wherein the barrier metal includes a stacked structure including a metal silicon nitride layer and a metal suicide layer;
    forming a second gate conductive layer and a gate hard mask over the barrier metal;
    patterning the gate hard mask, the second gate conductive layer, the barrier metal, the first gate conductive layer, and the gate insulation layer to form a gate pattern; and
    performing a plasma selective gate re-oxidation process on the gate pattern,
    wherein the first gate conductive layer includes a polysilicon layer and the second gate conductive layer includes a tungsten layer.

2. The method of claim 1, wherein performing the plasma selective gate re-oxidation process includes using at least one of oxygen ($O_2$)/hydrogen ($H_2$) and $O_2$/deuterium ($D_2$) as a reaction gas.

3. The method of claim 2, wherein performing the plasma selective gate re-oxidation process includes maintaining a temperature ranging from approximately 400° C. to approximately 800° C.

4. The method of claim 3, wherein performing the plasma selective gate re-oxidation process includes performing a plasma thermal treatment in one of a vacuum, nitrogen ($N_2$), and nitrous oxide ($N_2O$) atmosphere.

5. The method of claim 4, wherein performing the plasma selective gate re-oxidation process includes using one of radio frequency (RF) and microwave as a plasma generator.

6. The method of claim 1, wherein the metal silicon nitride layer includes one selected from the group consisting of a tungsten silicon nitride layer, a tantalum silicon nitride layer, a titanium silicon nitride layer, a molybdenum silicon nitride layer, a hafnium silicon nitride layer, a zirconium silicon nitride layer, a cobalt silicon nitride layer, a chromium silicon nitride layer, and a nickel silicon nitride layer.

7. The method of claim 1, wherein the metal silicide layer includes one selected from the group consisting of a tungsten silicide layer, a tantalum silicide layer, a titanium silicide layer, a molybdenum silicide layer, a hafnium silicide layer, a zirconium silicide layer, a cobalt silicide layer, a chromium silicide layer, and a nickel silicide layer.

8. The method of claim 7, wherein the tungsten silicide layer is formed in a thickness ranging from approximately 20 Å to approximately 200 Å.

9. The method of claim 1, wherein the metal silicide layer includes an amorphous tungsten silicide layer.

10. A method for fabricating a semiconductor device, the method comprising:

forming a gate insulation layer over a substrate;

forming a first gate conductive layer over the gate insulation layer;

forming a barrier metal over the first gate conductive layer, wherein the barrier metal includes a stacked structure including a metal silicon nitride layer and a metal silicide layer, wherein the metal silicide layer includes an amorphous tungsten silicide layer;

sequentially forming a second gate conductive layer and a gate hard mask over the barrier metal;

patterning the gate hard mask, the second gate conductive layer, the barrier metal, the first gate conductive layer, and the gate insulation layer to form a gate pattern; and performing a plasma selective gate re-oxidation process on the gate pattern, wherein the first gate conductive layer includes a polysilicon layer and the second gate conductive layer includes a tungsten layer.

* * * * *